(12) United States Patent
Kurita et al.

(10) Patent No.: US 8,272,830 B2
(45) Date of Patent: Sep. 25, 2012

(54) SCISSOR LIFT TRANSFER ROBOT

(75) Inventors: Shinichi Kurita, San Jose, CA (US);
Takayuki Matsumoto, San Jose, CA (US); Suhail Anwar, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 660 days.

(21) Appl. No.: 12/247,135

(22) Filed: Oct. 7, 2008

(65) Prior Publication Data

US 2010/0086380 A1   Apr. 8, 2010

(51) Int. Cl.
*B25J 18/02*   (2006.01)
(52) U.S. Cl. ............... 414/749.5; 74/490.01; 414/744.3; 901/17
(58) Field of Classification Search ............... 414/744.3, 414/735, 749.5; 901/28, 29, 15, 17; 74/490.08, 74/490.09, 490.01; 187/269
See application file for complete search history.

(56) References Cited

U.S. PATENT DOCUMENTS

| | | | |
|---|---|---|---|
| 2,993,675 A | 7/1961 | Tatter | |
| 3,901,356 A | 8/1975 | Butler | |
| 4,577,821 A | 3/1986 | Edmo et al. | |
| 4,744,712 A | 5/1988 | Mitchell | |
| 5,131,501 A | 7/1992 | Yoshikawa et al. | |
| 5,667,353 A * | 9/1997 | Drake | 414/744.3 |
| 5,694,864 A | 12/1997 | Langewellpott et al. | |
| 5,722,513 A | 3/1998 | Rowan et al. | |
| 6,182,796 B1 | 2/2001 | Perlstein et al. | |
| 6,371,713 B1 * | 4/2002 | Nishimura et al. | 414/222.13 |
| 6,662,673 B1 * | 12/2003 | Olgado | 74/490.01 |
| 6,679,479 B1 | 1/2004 | Watkins | |
| 6,742,768 B2 | 6/2004 | Alba | |
| 7,464,622 B2 * | 12/2008 | Markert et al. | 74/490.01 |
| 2006/0156851 A1 * | 7/2006 | Jacobsen et al. | 74/490.01 |
| 2008/0190707 A1 * | 8/2008 | Hoth | 187/269 |

FOREIGN PATENT DOCUMENTS

| | | |
|---|---|---|
| JP | 08124990 A | 5/1996 |
| JP | 10335413 A | 12/1998 |
| JP | 11087456 A | 3/1999 |
| JP | 11087460 A | 3/1999 |
| JP | 2006224297 A | 8/2006 |
| KR | 20050006445 | 1/2005 |

OTHER PUBLICATIONS

International Search Report and Written Opinion of the International Searching Authority mailed Apr. 29, 2010 in PCT/US2009/059570.

* cited by examiner

*Primary Examiner* — Donald Underwood
(74) *Attorney, Agent, or Firm* — Patterson & Sheridan, LLP

(57) ABSTRACT

A method and apparatus for a transfer robot that may be used in a vacuum environment is described. The transfer robot includes a lift assembly comprising a first platform and a second platform coupled to the first platform by a plurality of support members, the plurality of support members comprising a first pair of support members and a second pair of support members, a first drive assembly coupled to a portion of the plurality of support members, the first drive assembly providing a motive force to the plurality of support members to move the second platform in a first linear direction relative to the first platform, and an end effector disposed on the second platform and movable in a second linear direction by a second drive assembly, the second linear direction being orthogonal to the first linear direction.

13 Claims, 11 Drawing Sheets

SCISSOR LIFT TRANSFER ROBOT

BACKGROUND OF THE INVENTION

1. Field of the Invention

Embodiments of the present invention generally relate to a transfer robot for use in the transfer and support of large area flat media, such as a large area substrate.

2. Description of the Related Art

Flat media, such as rectangular, flexible sheets of glass, plastic or other material is typically used in the manufacture of flat panel displays, solar devices, among other applications. Materials to form electronic devices, films and other structures on the flat media are deposited onto the flat media by numerous processes. The processes are typically performed in a vacuum chamber which requires handling of the flat media numerous times to move the flat media in and out of the vacuum chamber.

The size of the flat media is getting larger with each generation in order to have more usable surface area for deposition and electronic device fabrication. Currently, the flat media includes a surface area of greater than 4 $m^2$ that is processed. However, the growth in size of the flat media presents unique handling challenges for conventional robotic equipment due to the flexible nature of the media. Further, the reduced pressures and temperature extremes the robot must endure create challenges which may limit the choices of drives, structural components, and the like. Therefore, there is a need in the art for a transfer robot equipped to endure low pressures and temperature extremes for handling flat media having large surface areas.

SUMMARY OF THE INVENTION

Embodiments described herein generally provide a method and apparatus for a transfer robot. In one embodiment, a transfer robot for use in a vacuum environment is described. The transfer robot includes a lift assembly comprising a first platform and a second platform, a plurality of support members coupling the first platform to the second platform. The plurality of support members comprise a first pair of support members having a first end rotatably coupled to the first platform and a second end coupled to the second platform by a first linear assembly, and a second pair of support members rotatably coupled to the second platform and a second end coupled to the first platform by a second linear assembly, the first pair and second pair of support members coupled together at a center thereof. The transfer robot further includes a first drive assembly coupled to the second pair of support members, the first drive assembly providing a motive force to the plurality of support members to change the angle of the second pair of support members relative to the first pair of support members to move the second platform in a first linear direction relative to the first platform, and an end effector assembly disposed on the second platform and movable in a second linear direction by a second drive assembly, the second linear direction being orthogonal to the first linear direction.

In another embodiment, a transfer robot for use in a vacuum environment is described. The transfer robot includes a lift assembly comprising a first base rotatably coupled to a second base and a platform, a plurality of support members coupling the second base to the platform, the plurality of support members comprising a first pair of support members having a first end rotatably coupled to the second base and a second end coupled to the platform by a first linear assembly, and a second pair of support members rotatably coupled to the platform and a second end coupled to the second base by a second linear assembly, the first pair and second pair of support members coupled together at a center thereof, a first drive assembly coupled to the second pair of support members, the first drive assembly providing a motive force to the plurality of support members to change the angle of the second pair of support members relative to the first pair of support members to move the platform in a first linear direction relative to the second base, and an end effector assembly disposed on the platform and movable in a second linear direction by a second drive assembly disposed in a hermetically sealed enclosure, the second linear direction being orthogonal to the first linear direction.

In another embodiment, a transfer robot for use in a vacuum environment is described. The transfer robot includes a first assembly comprising a fixed first base coupled to a second base by a first motor that rotates the second base relative to the first base, a platform, a plurality of support members coupling the second base to the platform, the plurality of support members pivotably coupled together at a center thereof, a second motor coupled to at least one of the plurality of support members, the second motor providing a motive force to one end of the at least one support member to pivot the at least one support member relative to other support members to move the platform in a first linear direction relative to the second base, and at least a first end effector assembly disposed on the platform that is movable in a second linear direction by a first linear drive that is at least partially disposed in a hermetically sealed enclosure, the second linear direction being orthogonal to the first linear direction.

In another embodiment, a method for supporting and transferring a large area substrate in a vacuum environment using a transfer robot comprising a first base, a second base, and an end effector assembly is described. The method includes providing a first motive force to the second base to rotate the second base relative to the first base, providing a second motive force to at least one support member coupled between the second base and the end effector assembly, the second motive force causing the at least one support member to pivot at a center thereof to move the end effector in a first linear direction relative to the second base, and providing a third motive force to the end effector assembly to move the end effector assembly in a second linear direction relative to the first linear direction, the second linear direction being orthogonal to the first linear direction.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments described herein provide a method and an apparatus for a transfer robot for supporting large area flat media, such as a large area substrate made of glass, plastic, or other material suitable for electronic device formation. The large area substrates as described herein may include an area of about 10,000 cm² or larger. It is contemplated that the transfer robot as described herein may also be beneficially utilized in the transfer of smaller substrates.

Figure 1:
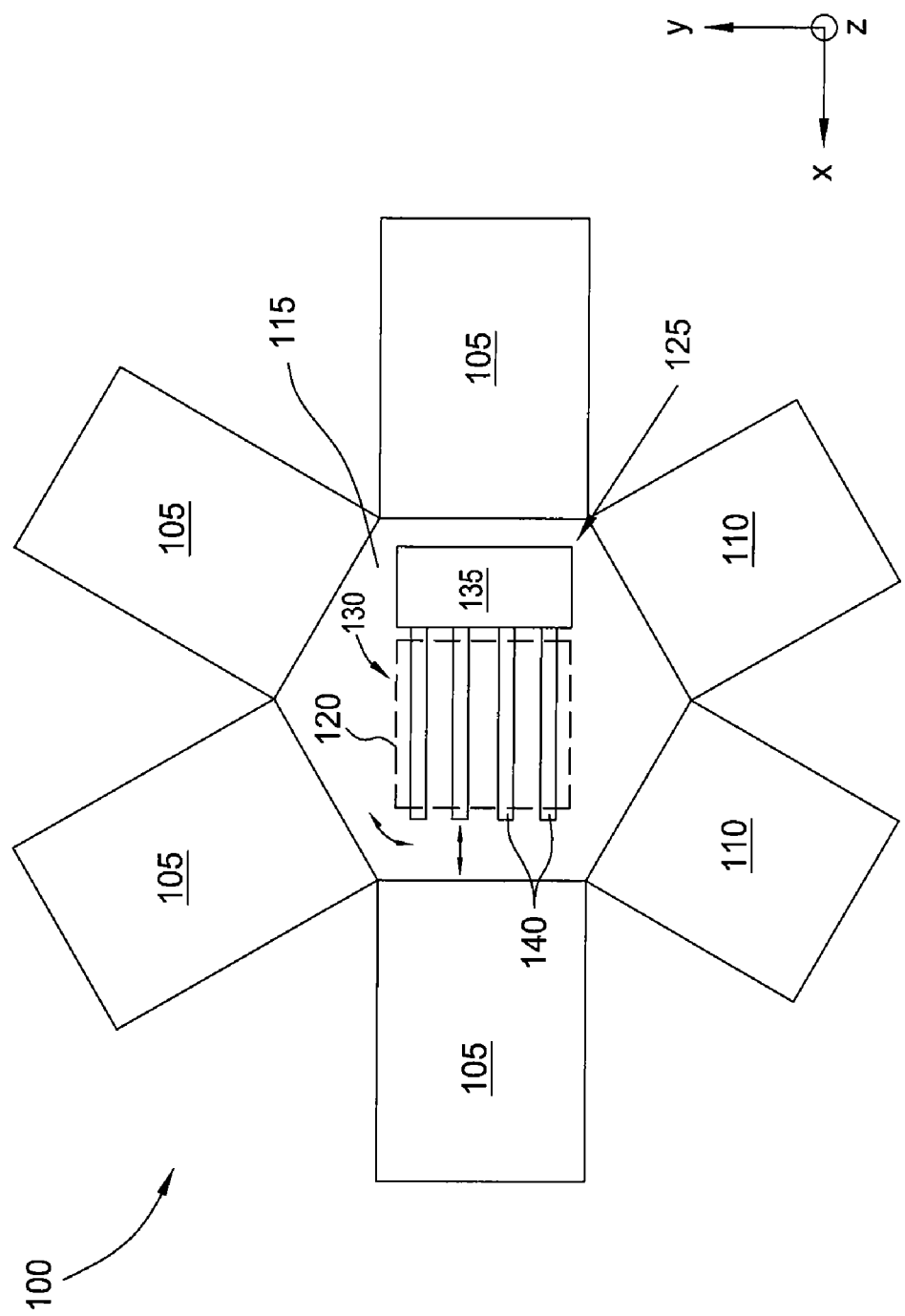
FIG. 1 is a top plan view of a multi-chamber substrate processing system.

FIG. 1 is a top plan view of a multi-chamber substrate processing system 100 suitable for the fabrication of thin-film transistors (TFT), organic light emitting diodes (OLEDS) and solar cell fabrication on flat media. The system 100 includes a plurality of processing chambers 105 and one or more load lock chambers 110 positioned around a central transfer chamber 115. The processing chambers 105 may be configured to complete a number of different processing steps to achieve a desired processing of flat media, such as a large area substrate 120.

Positioned within the central transfer chamber 115 is a transfer robot 125 having an end effector 130. The end effector 130 is configured to be supported and move independently of the transfer robot 125 to transfer the substrate 120. The end effector 130 includes a wrist 135 and a plurality of fingers 140 adapted to support the substrate 120. In one embodiment, the transfer robot 125 is configured to be rotated and/or linearly driven in a vertical direction while the end effector 130 is configured to move linearly in a horizontal direction independent of and relative to the transfer robot 125. For example, the transfer robot 125 raises and lowers the end effector 130 (Z direction) to various elevations within the central transfer chamber 115 to align the end effector 130 with openings in the processing chambers 105 and the load lock chambers 110. When the transfer robot 125 is at a suitable elevation, the end effector 130 is extended horizontally (X or Y direction) to transfer and/or position the substrate 120 into and out of any one of the processing chambers 105 and the load lock chambers 110. Additionally, the transfer robot 125 may be rotated to align the end effector 130 with other processing chambers 105 and the load lock chambers 110.

The central transfer chamber 115 is held at a reduced pressure during processing of substrates. In one embodiment, the pressure in the central transfer chamber 115 is maintained at a pressure lower than ambient pressure (i.e. pressure outside the system 100). For example, the pressure in the central transfer chamber may be about 7 Torr to about 10 Torr. In one embodiment, the maintained pressure within the central transfer chamber 115 may be substantially equal to the pressure within the processing chambers 105 and/or load lock chambers 110.

Figure 2A:
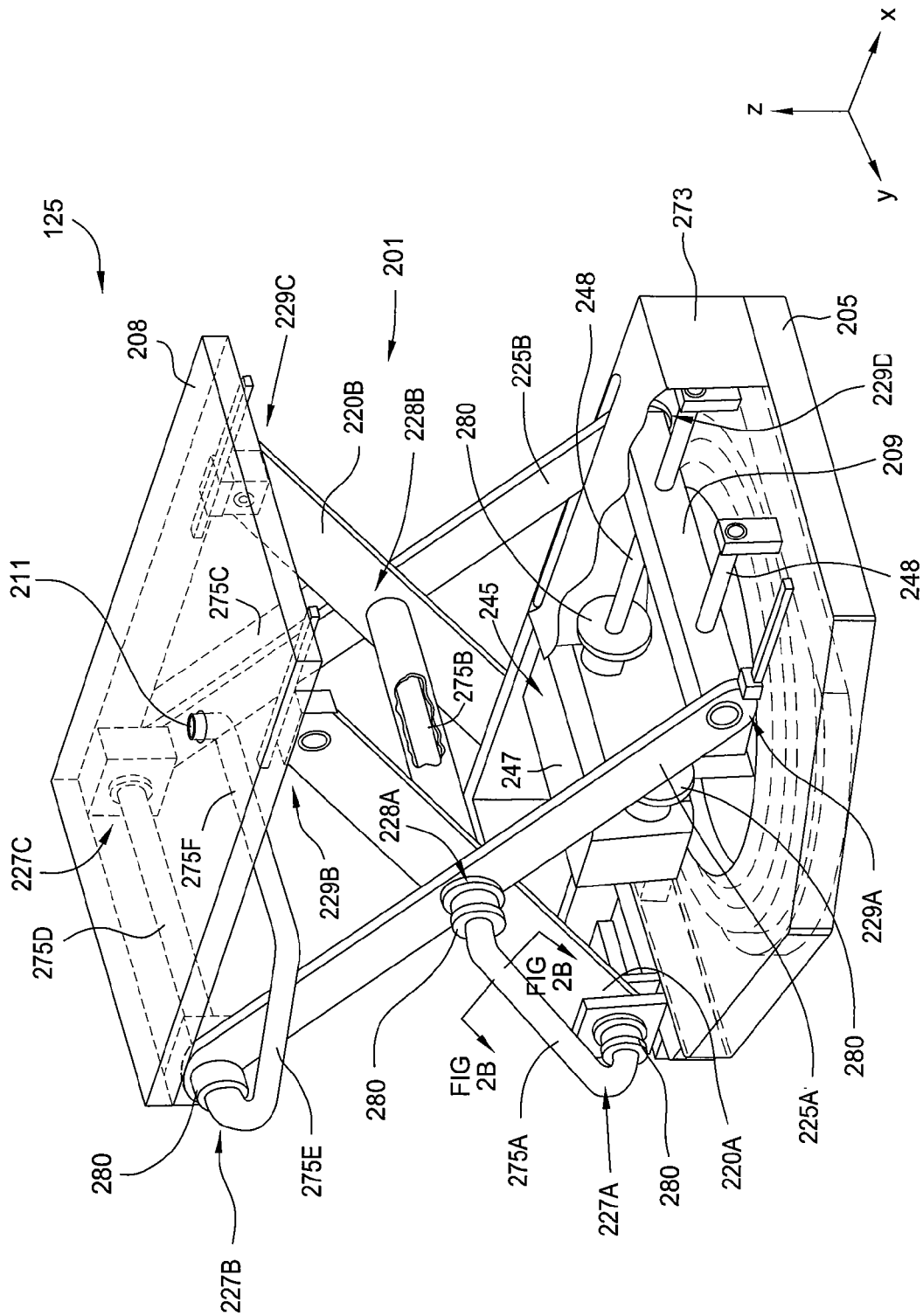
FIG. 2A is an isometric view of one embodiment of a transfer robot that may be used in the processing system of FIG. 1.

FIG. 2A is an isometric view of one embodiment of a transfer robot 125 that may be used in the transfer chamber 115 of FIG. 1. The transfer robot 125 includes a first assembly 201 adapted to rotate and move vertically (Z direction). In FIG. 2A, a second assembly, which includes an end effector, is not shown for clarity in describing the first assembly 201. The first assembly 201 includes a plurality of support arms 220A, 220B and 225A, 225B coupled between a first platform 205 and a second platform 208. In one embodiment, the first platform 205 comprises a rotatable base. The platform 208 provides an upper surface to receive and support the second assembly, which is adapted to move linearly relative to the platform 208. The plurality of support arms 220A, 220B, 225A 225B include a plurality of pivot points 227A-227D (227D is not shown in this view) and a plurality of movable coupling points 229A-229D. The plurality of support arms 220A, 220B and 225A, 225B are rotatably coupled to each other at a pair of central pivot points 228A and 228B.

A linear actuator 245 is coupled between the base 205 and support arms 225A, 225B at the movable coupling points 229A, 229D. The linear actuator 245 includes a motor housing 247 coupled to the base 205 and at least one drive shaft 248 (two are shown) that controls the motion of the ends of the support arms 225A, 225B in the X direction relative to the housing 247. The motor housing 247 may include a drive system, such as a motor and a reduction gear unit coupled to the at least one drive shaft 248. In one embodiment, the drive shaft 248 is a lead screw or Acme thread screw.

One end of each of the support arms 225A, 225B is coupled to the shaft 248 by a cross member 209 while the opposing ends of each of the support arms 225A, 225B are coupled to the platform 208 at pivot points 227B and 227C. In one embodiment, the cross member 209 includes a nut or other device adapted to transfer the rotatable motion of the shaft 248 to the cross member 209. One end of each of the support arms 220A, 220B are rotatably coupled to the base 205 at pivot points 227A, 227D while the opposing end of each of the support arms 220A, 220B are movably coupled to the platform 208 at movable coupling points 229B, 229C. The linear actuator 245 is adapted to provide a motive force to the support arms 225A, 225B thereby causing relative movement between support arms 220A, 220B and 225A, 225B that changes the elevation of the platform 208 relative to the first platform 205. In one embodiment, the linear actuator 245 may be a pneumatic or hydraulic cylinder, a Sawyer motor, or other suitable linear actuator. A cover 273, a portion of which has been removed, is disposed over the drive shafts 248 and the movable coupling points 229A, 229D.

The first assembly 201 also includes a plurality of conduits 275A-275F (275D and portions of 275C, 275F are shown in phantom in this view) configured to provide electrical and fluid communication to the end effector (not shown) through the base 205. The conduits 275A-275F provide an electrical and/or fluid path from an source (not shown) to a port 211 in the platform 208. At least a portion of the conduits 275A-275F are adapted to move with the support arms 220A, 220B, 225A, 225B. To provide this movement, at least a portion of the conduits 275A-275F are connected to each other by rotary seals 280 coupled between respective ends of the conduits 275A-275F. Rotary seals 280 are also coupled to the drive shafts 248. In one embodiment, the rotary seals 280 coupled to the conduits 275A-275F are configured as rotatable feedthroughs for electrical signals, wires, and/or fluids, such as cooling fluids. Each rotary seal 280 may be a magnetic vacuum seal that is configured to withstand negative pressure while sealing and facilitating rotation. In one aspect, each of the conduits 275A-275F are collectively configured as a hermetically sealed conduit for a fluid and any components that may be housed therein.

Figure 2B:
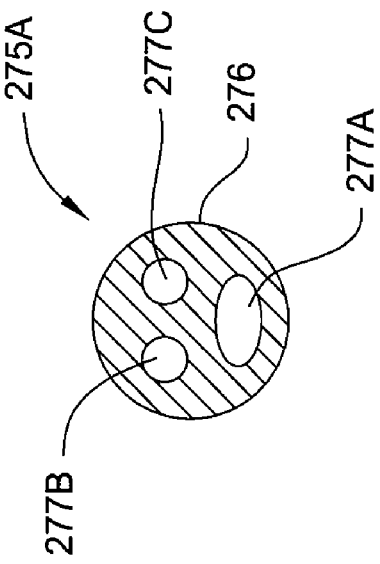
FIG. 2B is a cross-sectional view of one embodiment of a conduit.

FIG. 2B is a cross-sectional view of one embodiment of the conduit 275A of FIG. 2A. While not shown, other conduits 275B-275F (shown in FIG. 2A) are configured similarly. The conduit 275A includes a tubular body 276 having at least three internal passages 277A-277C formed therein. The internal passage 277A is adapted to contain wiring or signal cables while the internal passages 277B and 277C are configured as fluid passages. In one embodiment, the internal passage 277B is configured as a return path for cooling fluid and the internal passage 277C is configured as a supply path for cooling fluid. The conduit 275A may be fabricated from materials such as aluminum, stainless steel, nickel plated carbon steel or other suitable material.

Figure 3A:
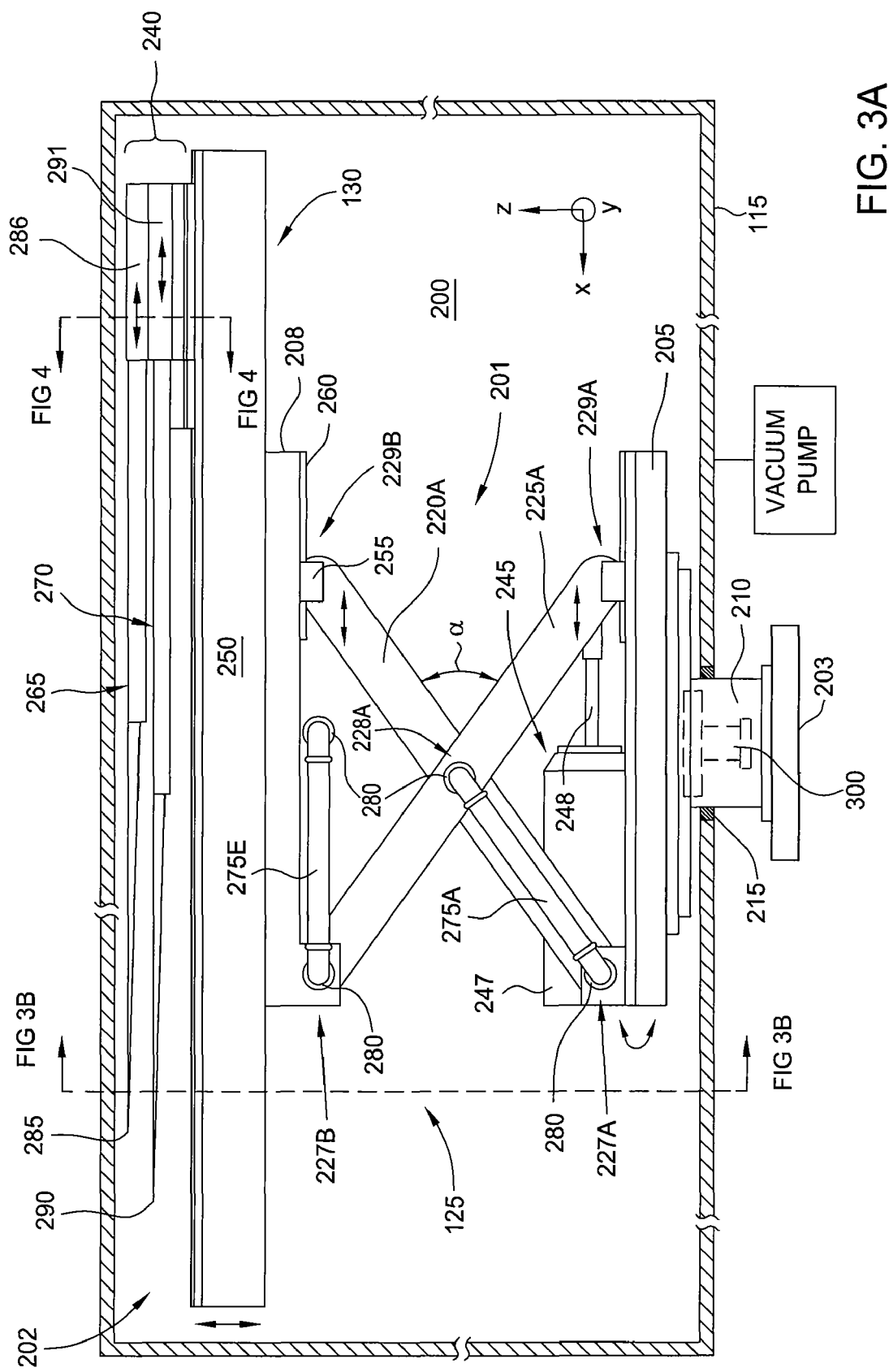
FIG. 3A is a side view of another embodiment of a transfer robot.

FIG. 3A is a side view of the transfer robot 125 of FIG. 1. The transfer robot 125 is positioned within a vacuum enclosure 200 of a transfer chamber 115 as shown in FIG. 1. The transfer robot 125 includes the first assembly 201 adapted to rotate and move in a vertically (Z direction) and a second assembly 202 adapted to move laterally or horizontally (X direction). The vacuum enclosure 200 is sized to allow the transfer robot 125 to move and transfer substrates therein. Negative pressure is provided to the vacuum enclosure 200 by a vacuum pump adapted to maintain a low pressure within the vacuum enclosure 200. In one embodiment, the transfer robot 125 comprises a first or fixed base 203 that is fixed relative to the transfer chamber 115 and a first platform 205 coupled by a support stem 210. In one embodiment, the first platform comprises a second base that is rotatable relative to the first base 203. The first base 203 may be fastened to a clean room floor or other structure adapted to provide a foundation for the transfer robot 125.

A rotational drive system 300 (shown in phantom) is disposed in one or both of the support stem 210 and the first platform 205 to provide rotational movement between the fixed base 203 and first platform 205. In one embodiment, the rotational dive system 300 includes a motor and reduction gear unit coupled to a pinion gear. The pinion gear interfaces with a ring gear that is coupled to the first platform 205. A seal 215 is provided at the interface between the bottom of the transfer chamber 115 and the support stem 210 to maintain the vacuum environment within the vacuum enclosure 200. The seal 215 may be a polymeric or elastomeric member, or other material adapted to withstand negative pressure, vibration or movement between the transfer robot 125 and support stem 210.

The linear actuator 245 is coupled between the base 205 and support arms 225A, 225B (225B is not shown in this view) at the movable coupling points 229A, 229D (only 229A is shown in this view). The linear actuator 245 includes the housing 247 coupled to the base 205 and the movable shaft 248. The movable shaft 248 moves in the X direction relative to the housing 247 to provide lateral movement to the movable coupling points 229A, 229D. The lateral movement of the movable coupling points 229A, 229D causes a change in an angle α between support arms 225A and 220A (and 220B which is not shown in this view), which facilitates vertical (Z direction) movement of the platform 208. For ease of description, portions of the support arms, and pivot and coupling points, which are not shown or hidden in FIG. 3A, will not be discussed unless otherwise noted. It is understood that the description of the support arms, and pivot and coupling points that are shown in this view have corresponding elements that are not shown and operate similarly, unless otherwise noted.

As explained above, one end of support arm 225A is coupled the shaft 248, while the opposing end of support arm 225A is coupled to the platform 208 at pivot point 227B. The platform 208 provides a mounting surface for the second assembly 202, which includes a base or frame portion 250 of an end effector 130. One end of support arm 220A is rotatably coupled to the base 205 at pivot point 227A while the opposing end of support arm 220A is movably coupled to the frame portion 250 at movable coupling point 229B. In one embodiment, the movable coupling point 229B includes a guide block 255 that is movable relative to a guide rail 260. The guide block 255 is coupled to the end of support arm 220A while the guide rail 260 is coupled to the platform 208. In one embodiment, the guide block 255 and guide rail 260 comprise a linear bearing assembly. A cover (not shown) may be disposed over the guide block 255 and guide rail 260 to prevent particles that may be generated by the relative movement of the movable coupling point 229B from entering the vacuum enclosure 200. The linear actuator 245 is adapted to provide a motive force to the support arm 225A thereby causing a relative movement between support arms 220A, 225A that changes the elevation of the end effector 130 relative to the base 205.

The second assembly 202 includes an end effector assembly 240 used to support and transfer a substrate (not shown). The end effector assembly 240 includes one or more end effector modules, such as an upper end effector module 265 and a lower end effector module 270. Each of the end effector modules 265, 270 are movably coupled to the frame portion 250 in a manner that allows independent movement of each end effector module 265, 270. Structural components of the first assembly 201 and second assembly 202 may be fabricated from materials such as aluminum, stainless steel, carbon steel with a plating, for example, a nickel plating, and combinations thereof among other suitable materials.

The upper and lower end effector modules 265, 270 are used to transport a substrate (not shown) within the vacuum enclosure 200. The substrate is supported on a plurality of support surfaces 285 and 290 that are configured as fingers extending from a corresponding wrist 286, 291. Each of the end effector modules 265, 270 are adapted to support and transfer a substrate thereon by movement relative to each other and the frame portion 250 in the X direction.

As the substrate is transferred or otherwise supported by the end effector modules 265, 270, the substrate may be at a temperature greater than the operating temperature of the various components of the transfer robot 125 and end effector assembly 240. The excess heat from the substrate may be transferred to the transfer robot 125 that may damage components of the transfer robot 125. Temperature control of the transfer robot 125 is provided by the plurality of conduits 275A-275F (only 275A and 275E are shown in this view) adapted to provide a fluid to the end effector assembly 240 and other portions of the transfer robot 125 as will be explained in greater detail in FIGS. 7A-8B. The conduits 275A-275F may additionally include apertures as shown in FIG. 2B for wires providing electrical signals to the end effector assembly 240. At least a portion of the conduits 275A-275F are adapted to move with the support arms 220A, 225A and at least a portion of the conduits 275A-275F are connected to each other by rotary seals 280 coupled between respective ends of the conduits 275A-275F.

Figure 3B:
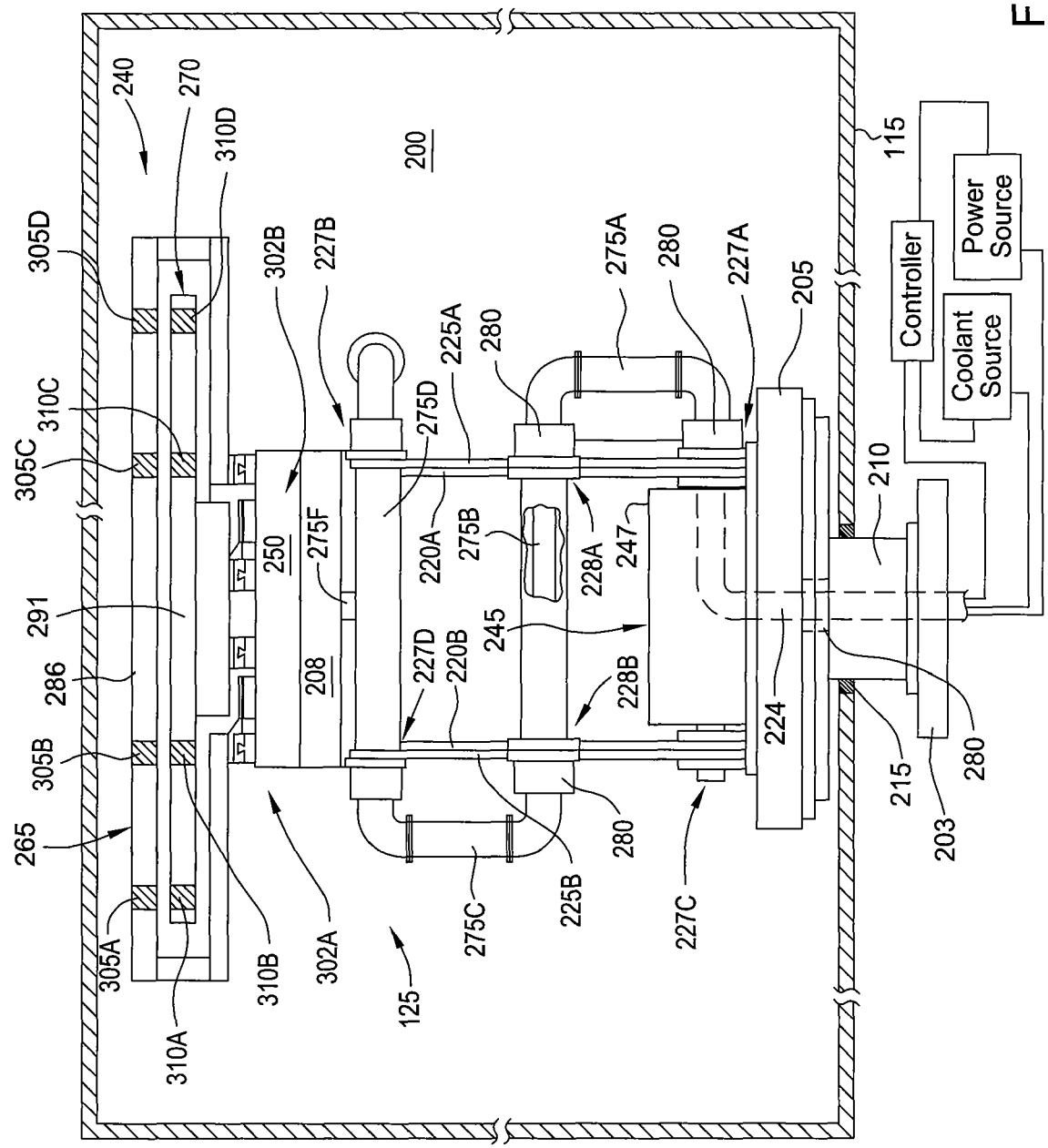
FIG. 3B is an end view of the transfer robot of FIG. 3A.

FIG. 3B is an end view of the transfer robot 125 of FIG. 3A. In this view, a fluid and/or signal path from the base 205 to the end effector frame portion 250 is more clearly seen. The fluid and/or signal path is provided by a feed conduit 224 coupled to a coolant source, a power source, and a controller. The feed conduit 224 extends through the base 205 and is adapted to rotate with the base 205 by use of a rotary seal 280. Feed conduit 224 couples to conduit 275A and the fluid and/or signals are provided to the end effector frame portion 250 by conduit 275F. In one embodiment that will be described in greater detail in FIGS. 7A-8B, the frame portion 250 and drive systems for the end effector assembly 240 are provided with a cooling fluid from the coolant source. The fluid provided by the coolant source may be water, de-ionized water (DIW), ethylene glycol, nitrogen ($N_2$), helium (He), or other fluid used as a heat exchange medium.

Each of the upper and lower end effector modules 265, 270 include a plurality of extended members or fingers 305A-305D and 310A-310D, respectively. In this Figure, the upper end effector module 265 includes four fingers 305A-305D coupled to a first wrist 286 and the lower end effector module 270 includes four fingers 310A-310D coupled to a second wrist 291. Each of the fingers 305A-305D and 310A-310D include a collective upper surface that is substantially planar and adapted to support a substrate thereon. While four fingers are shown on each of the wrists 286, 291, any number of fingers may be used.

The upper and lower end effector modules 265, 270 are independently movable relative to the transfer robot 125 and each other. The end effector modules 265, 270 are coupled to independent drive assemblies 302A, 302B disposed in the end effector frame portion 250 which are described in more detail below. Independent and relative movement of the upper and lower end effector modules 265, 270 is provided by a first drive assembly 302A coupled to the lower end effector module 270 and a second drive assembly 302B coupled to the upper end effector module 265.

Figure 4:
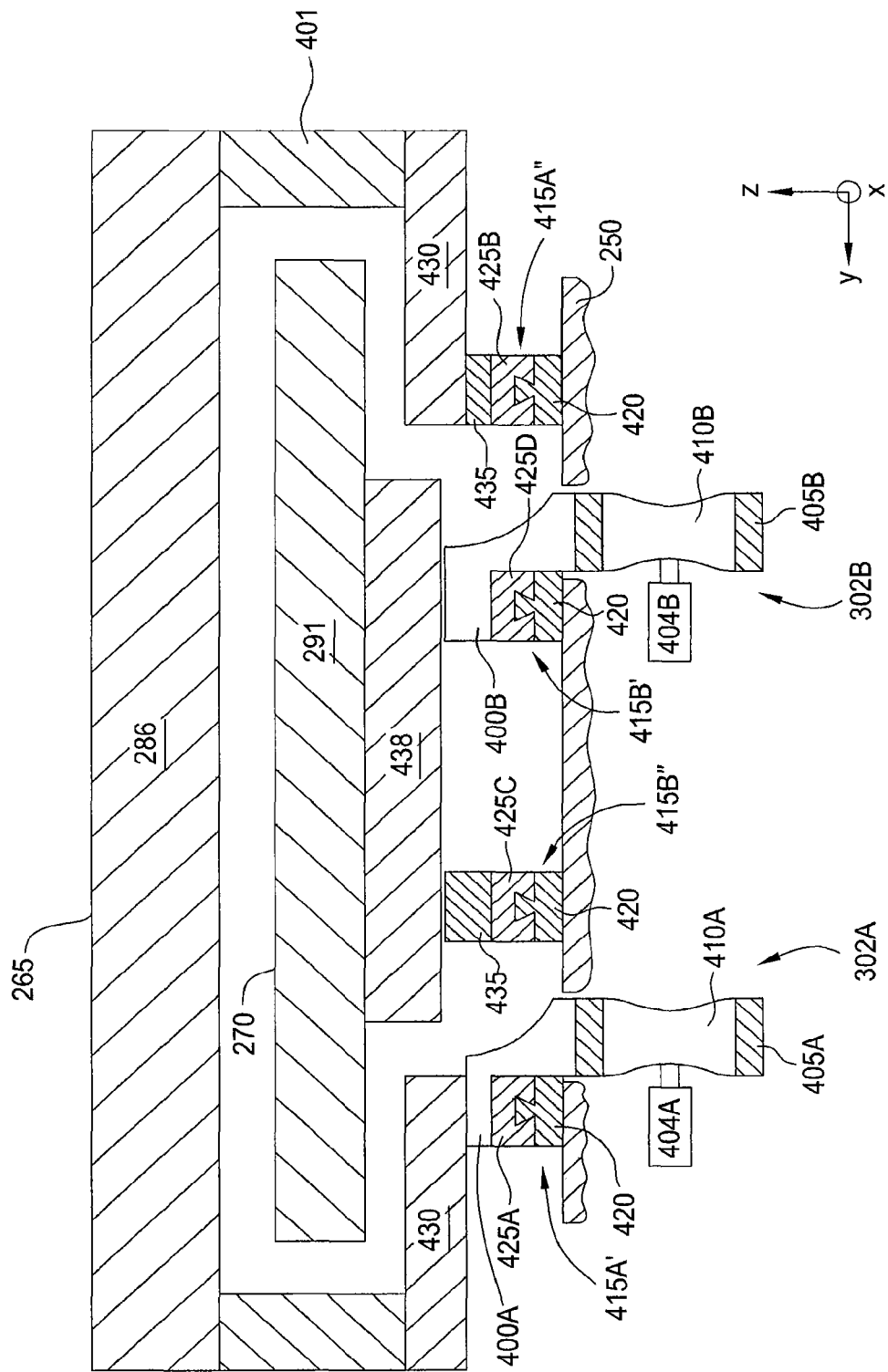
FIG. 4 is a cross-sectional view of the end effector modules of FIG. 3A.

FIG. 4 is a cross-sectional view of the end effector modules 265, 270 of FIG. 3A. The upper end effector module 265 is coupled to a first drive assembly 302A and the lower end effector module 270 is coupled to a second drive assembly 302B. The first drive assembly 302A includes a first connector 400A that is fixedly coupled to the upper end effector module 265 and a first belt 405A. The first belt 405A is coupled to a first drive pulley 410A that rotates to move the first belt 405A. The first drive pulley 410A is coupled to a motor 404A to provide rotational movement to the first drive pulley 410A. Relative movement between the upper surface of the end effector frame portion 250 and the upper end effector module 265 is provided by a plurality of linear bearing assemblies 415A', 415A" coupled between the end effector frame portion 250 and the upper end effector module 265.

Each of the linear bearing assemblies 415A', 415A" may include a plurality of first rails 420 fixedly coupled to an upper surface of the end effector frame portion 250. Each of the first rails 420 are movably mounted to a respective second rail 425A that is coupled to the first connector 400A and a respective second rail 425B that is coupled to a split wrist support 430. The split wrist support 430 is adapted to support the first wrist 286 at each end of the first wrist 286 by spacers 401 while providing ample room for the second wrist 291 of the lower end effector module 270 to move relative to the upper end effector module 265. Each of the second rails 425A, 425B may have a channel disposed therein to receive and move relative to the first rail 420. Bearings (not shown) may be provided at the interface between the first rails 420 and the second rails 425A, 425B. The second rail 425A is coupled to the split wrist support 430 by the first connector 400A and the second rail 425B is coupled to the split wrist support 430 by a shim 435.

In operation, the motor 404A associated with the first drive assembly 302A is actuated to rotate the first drive pulley 410A to move the first belt 405A. Movement of the first belt 405A is translated to the split wrist support 430. The split wrist support 430, which is coupled with the first drive pulley 410A and the second rails 425A, 425B, is moved relative to the end effector frame portion 250 and the lower end effector module 270. Thus, the upper end effector module 265 may be moved in the X direction relative to the lower end effector module 270 and/or the end effector frame portion 250.

The lower end effector module 270 is coupled to a second drive assembly 302A. The second drive assembly 302B includes a second connector 400B that is fixedly coupled to the lower end effector module 270 and a second belt 405B. The second belt 405B is coupled to a second drive pulley 410B that rotates to move the second belt 405B. The second drive pulley 410B is coupled to a motor 404B to provide rotational movement to the second drive pulley 410B. Relative movement between the upper surface of the end effector frame portion 250 and the lower end effector module 270 is provided by a plurality of linear bearing assemblies 415B', 415B" coupled between the end effector frame portion 250 and the lower end effector module 270.

Each of the linear bearing assemblies 415B', 415B" may include a plurality of first rails 420 fixedly coupled to an upper surface of the end effector frame portion 250. Each of the first rails 420 are movably mounted to a respective second rail 425D that is coupled to the second connector 400B and a respective second rail 425C that is coupled to a wrist support 438. The wrist support 438 is adapted to support the second wrist 291 while providing ample room for the first wrist 286 of the upper end effector module 265 to move relative to the lower end effector module 270. Each of the second rails 425C, 425D may have a channel disposed therein to receive and move relative to the first rail 420. Bearings (not shown) may be provided at the interface between the first rails 420 and the second rails 425C, 425D. The second rail 425D is coupled to the wrist support 438 by the second connector 400B and the second rail 425C is coupled to the wrist support 438 by a shim 435.

In operation, the motor 404B associated with the second drive assembly 302B is actuated to rotate the second drive pulley 410B to move the second belt 405B. Movement of the second belt 405B is translated to the wrist support 438. The wrist support 438, which is coupled with the second drive pulley 410B and the second rails 425C, 425D, is moved relative to the end effector frame portion 250 and the upper end effector module 265. Thus, the lower end effector module 270 may be moved in the X direction relative to the upper end effector module 265 and/or the end effector frame portion 250.

The motors 404A, 404B associated with each drive assembly 302A, 302B may be electrical motors, pneumatic motors, hydraulic motors or other type of motor or actuator suitable to provide the desired motion. Each of the first and second drive pulleys 410A, 410B may include a roughened surface or gear teeth (not shown) adapted to mesh with the inner surface of the belts 405A, 405B. Likewise, an inner surface of the belt may include a roughened surface or teeth to interface with the drive pulleys 410A, 410B. While each drive assembly 302A, 302B is described with motors and belts, other types of drives may be used to provide relative movement to the upper and lower end effector modules 265, 270. Other linear drives, such as magnetically actuated linear drives, may be used for the drive assemblies 302A, 302B.

Figure 5:
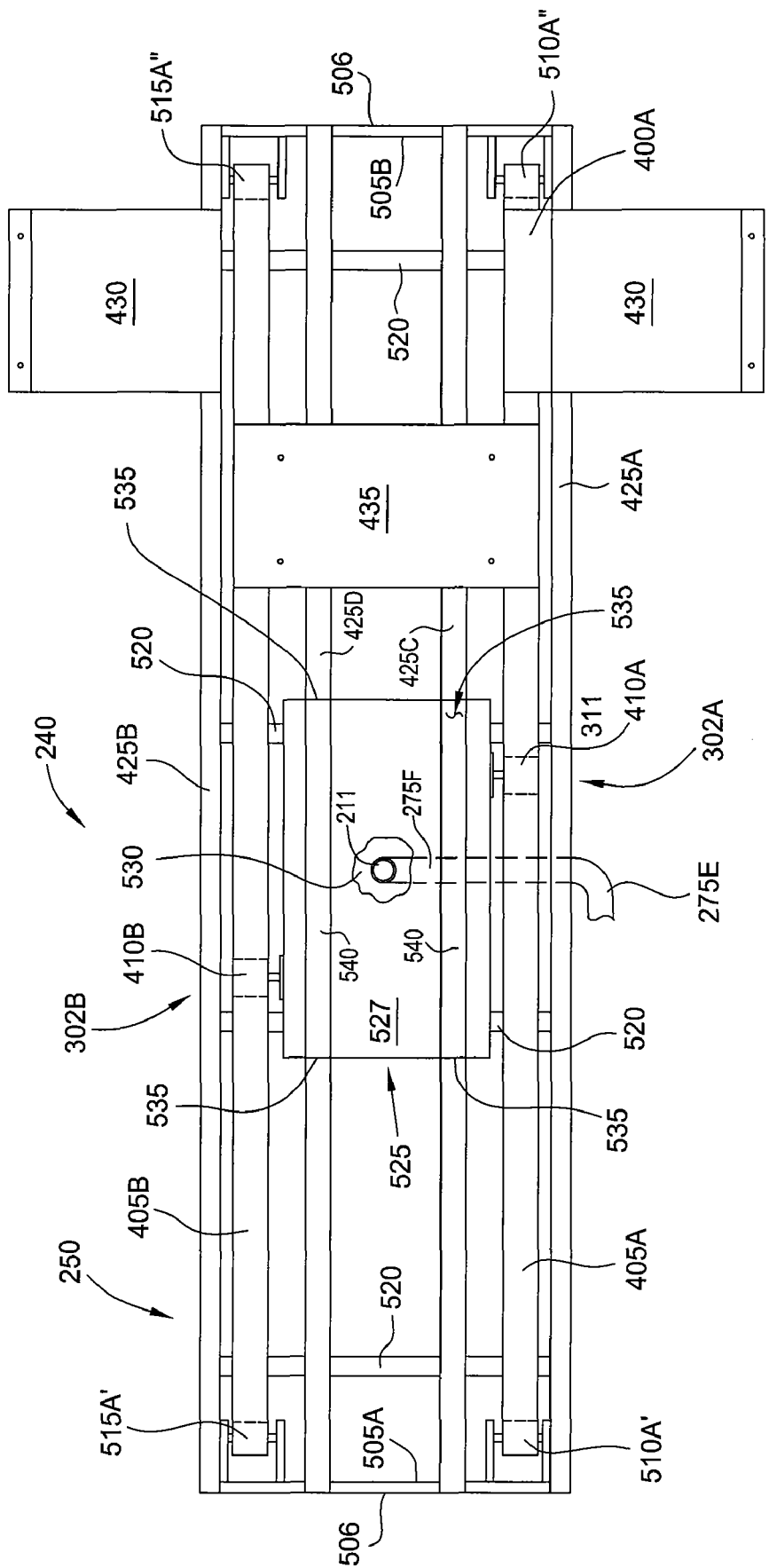
FIG. 5 is a top plan view of one embodiment of an end effector assembly.

FIG. 5 is a top plan view of one embodiment of an end effector assembly 240. In FIG. 5, the wrists 286 and 291 are not shown for clarity to show portions of the first drive assembly 302A and second drive assembly 302B disposed on the end effector frame portion 250. In this embodiment, the first drive assembly 302A includes the first drive pulley 410A and a plurality of idler pulleys 510A' and 510A" coupled to a drive belt 405A. The first drive pulley 410A is coupled to a motor (not shown). The first drive assembly 302A also includes the second rails 425A, 425B that are coupled to each other at opposing ends by cross-members 505A, 505B. Each of the cross-members 505A, 505B include a reflective surface 506 adapted to reflect heat away from the end effector assembly 240. The reflective surface 506 may be a polished surface of the material comprising the cross-members 505A, 505B, a sheet of reflective material, or a reflective coating. The second drive assembly 302B includes the second drive pulley 410B and a plurality of idler pulleys 515A' and 515A" coupled to a drive belt 405B. The second drive pulley 410B is coupled to a motor (not shown). The second drive assembly 302B also includes the second rails 425C, 425D that is coupled to each other at opposing ends by the cross-members 505A, 505B. Additional cross-members 520 may be coupled to or disposed between each of the second rails 425A-425D to provide mechanical integrity to the end effector frame portion 250.

The end effector assembly 240 also includes a housing 525 adapted to contain at least a portion of the motors driving each of the first drive assembly 302A and second drive assembly 302B, wires, controllers, and valves and associated plumbing for coolant devices. The housing 525 includes an interior volume 530 that is sealed from low pressures in the vacuum enclosure 200 (FIG. 3A). In one aspect, the housing 525 is configured as a hermetically sealed enclosure adapted to seal and protect components disposed therein from negative pressures within the vacuum enclosure 200. The housing 525 is in communication with the fluid and/signal path provided by a port 211 coupled to the plurality of conduits 275A-275F (FIG. 2A) disposed on the transfer robot 125. The housing 525 includes a removable lid 527 and a portion of which is removed to show the interior volume 530. Electrical signals and/or fluids are transferred to or from the housing 525 by the conduit 275F (FIG. 2A) through the port 211.

In one embodiment, the lid 527 includes at least a portion of the second rails 425C, 425D disposed on an upper surface thereof. The lid 527 may be removed to access the interior volume 530 and a portion of the second rails 425C, 425D coupled thereto are also removed. In this embodiment, the second rails 425C, 425D include terminating ends 535 that define discrete sections 540 of the second rails 425C, 425D that are coupled to the lid 527 and are removed with the lid 527.

Figure 6:
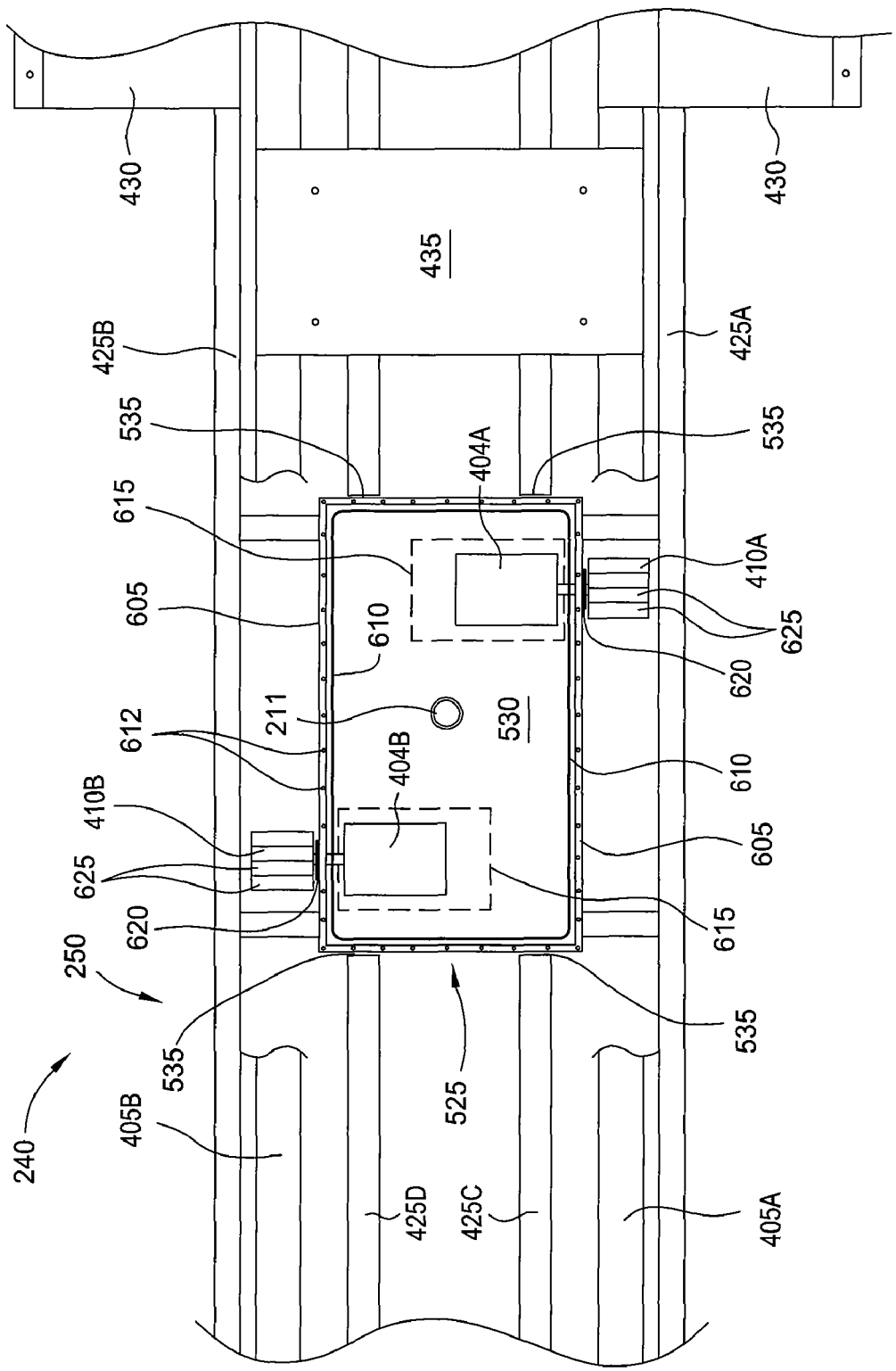
FIG. 6 is a top plan view of the end effector assembly shown in FIG. 5.

FIG. 6 is a top plan view of the end effector assembly 240 shown in FIG. 5 wherein the lid has been removed to more clearly show portions of the interior volume 530 of the housing 525. The housing 525 includes a plurality of sidewalls 605 and a sealing device 610 disposed on an upper surface of the sidewalls 605. The sealing device 610 may be an o-ring or gasket made of a polymeric or elastomeric material, or other compressible material adapted to seal the interior volume 530 from lower pressures that may be present in the vacuum enclosure 200 (FIG. 3A). The lid (not shown) is sealably coupled to the housing by a plurality of fasteners (not shown), such a screws or bolts, adapted to be received by a plurality of holes 612 disposed on an upper surface of the housing 525.

The housing 525 is adapted to maintain the pressure in the interior volume 530 at a pressure that is different than a pressure within the vacuum enclosure 200 in order to protect the components disposed therein and/or prevent particle contamination to the vacuum enclosure 200. For example, the interior volume 530 may be maintained at or near ambient pressure while the vacuum enclosure 200 is at a pressure that is substantially lower than ambient pressure. The sealed housing 525 prevents or minimizes outgassing from components or elements contained in the housing 525. Additionally, the sealed housing 525 contains any particles generated by the moving components disposed in the housing 525. In this manner, outgassing and particle contamination of the vacuum enclosure 200 may be avoided.

In one embodiment, one or both of the motors 404A, 404B are enclosed in a motor housing 615. Additionally, the motor housings 615 may provide additional sealing from negative pressures within the vacuum enclosure 200. Each of the motors 404A, 404B may include a reduction gear drive coupled between the motor and the drive pulleys 410A, 410B. Rotatable vacuum bearings or seals 620 may be provided at the interface between each motor 404A, 404B and the sidewall 605 to facilitate rotation of the respective shaft of each motor 404A, 404B while maintaining a pressure seal. Gears or teeth 625 are also shown on the drive pulleys 410A, 410B to provide a positive drive interface with respective belt 405A, 405B.

Figure 7B:
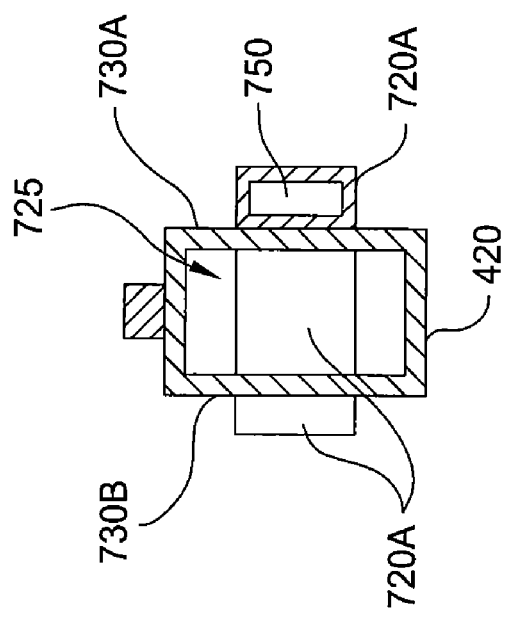
FIG. 7B is a cross-sectional view of the first rail and a portion of the first conduit of FIG. 7A.
Figure 7A:
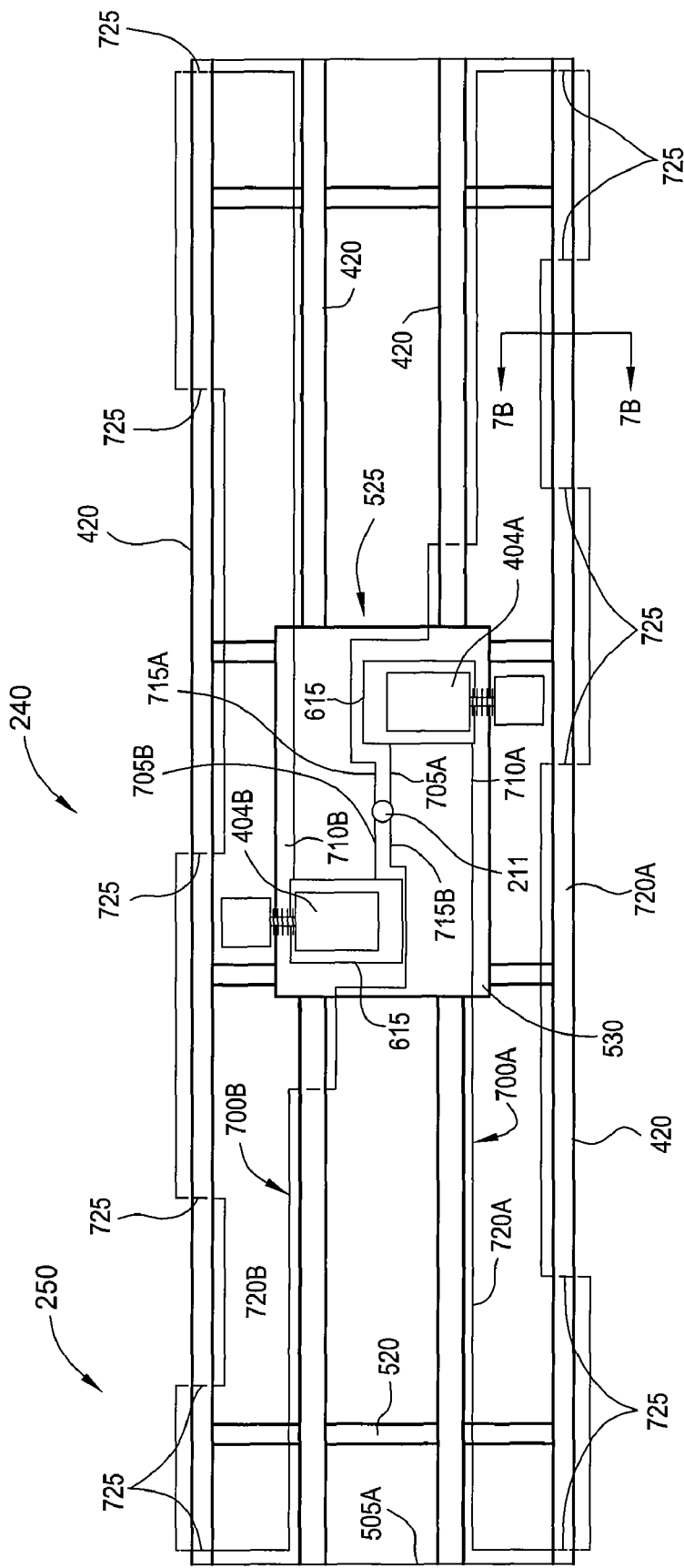
FIG. 7A is a schematic top view of another embodiment of an end effector assembly.

FIG. 7A is a schematic top view of another embodiment of an end effector assembly 240 showing a plurality of coolant lines 700A and 700B. The coolant lines 700A, 700B are coupled to the port 211 and are in thermal communication with the motor housings 615 and the end effector frame portion 250. In one embodiment, a first coolant line 700A includes a first inlet 705A that is coupled between the motor housing 615 surrounding motor 404A and the port 211. Cooling fluid flows from the port 211 through conduits (not shown) in the motor housing 615 coupled to a first outlet 710A. Cooling fluid flows from the first outlet 710A along a path defined by a first conduit 720A that is adjacent to and/or in thermal communication with the first rails 420. The cooling fluid flows through the first conduit 720A to a first return inlet 715A at the port 211. In one embodiment, the first conduit 720A is coupled to sidewalls of the first rails 420 and portions of the first conduit 720A are at least partially disposed within the first rails 420 at a plurality of feed-throughs 725.

A second coolant line 700B includes a second inlet 705B that is coupled between the motor housing 615 surrounding motor 404B and the port 211. Cooling fluid flows from the port 211 through conduits (not shown) in the motor housing 615 coupled to a second outlet 710B. Cooling fluid flows from the second outlet 710B along a path defined by a second conduit 720B that is adjacent to and/or in thermal communication with the first rails 420. The cooling fluid flows through the second conduit 720B to a second return inlet 715B at the port 211. The second conduit 720B is coupled to the sidewalls of the first rails 420 and portions of the second conduit 720B are at least partially disposed in the first rails 420 at a plurality of feed-throughs 725.

FIG. 7B is a cross-sectional view of the first rail 420 and a portion of the first conduit 720A of FIG. 7A. In one embodiment, the first rail 420 is a tubular member and the first conduit 720A is coupled to sidewalls 730A, 730B of the first rail 420. The first conduit 720A is coupled to an inner sidewall 730A and is disposed through the first rail 420 at the feed-through 725. The first conduit 720A may include a tubular cross-section to define a fluid plenum 750 disposed therein. One or both of the first rail 420 and the first conduit 720A may be made of a thermally conductive material, such as aluminum, stainless steel, or nickel plated carbon steel. The first conduit 720A may be coupled to the first rail 420 by clamps, fasteners, welding, or other bond. The cooling fluid removes heat from the first rail 420 that may be transferred to the first rail 420 from a substrate (not shown) supported on the end effector (not shown).

Figure 8A:
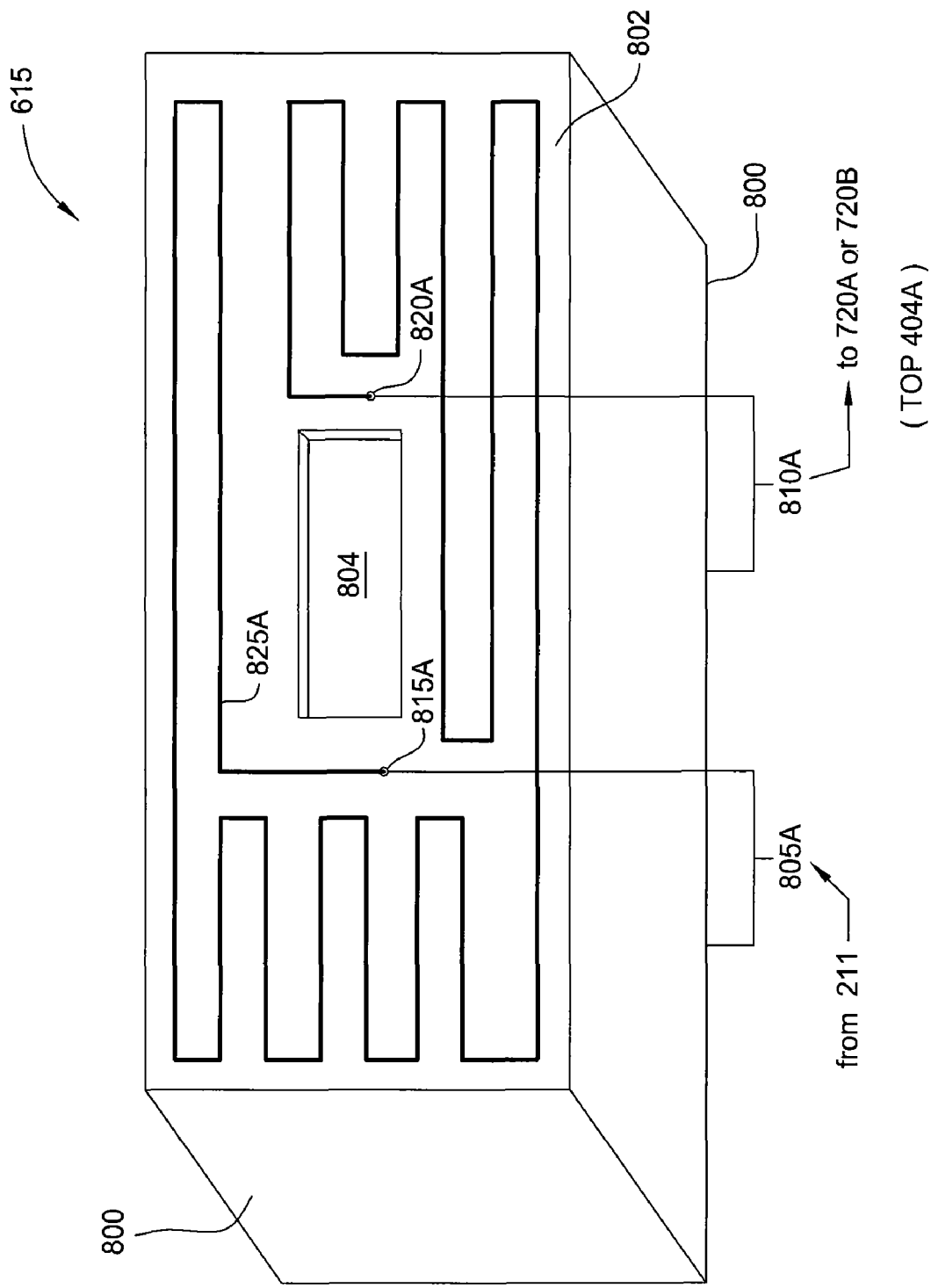
FIG. 8A is an isometric top view of one embodiment of a motor housing.

FIG. 8A is an isometric top view of one embodiment of a motor housing 615. The motor housing 615 includes a plurality of sidewalls 800 and a lid 802. The lid 802 may also include a sealable opening 804 for electrical lines or signal cables routed to the motor enclosed therein. The lid 802 may be removable for access to the interior volume of the housing 615. The lid 802 is coupled to any inlet 805 that may be either of the first inlet 705A or second inlet 705B of FIG. 7A. The inlet 805 is coupled to an inlet port 815A which is coupled to a cooling channel 825A formed in or disposed on the lid 802. Cooling fluid flows from the inlet 805 to the inlet port 815A and through the cooling channel 825A to an outlet port 820A. The outlet port 820A is coupled to an outlet 810 that may be either of the first outlet 710A or second outlet 710B of FIG. 7A. Cooling fluid flows from the outlet 810 to either one of the first conduit 720A or the second conduit 720B (FIG. 7A).

Figure 8B:
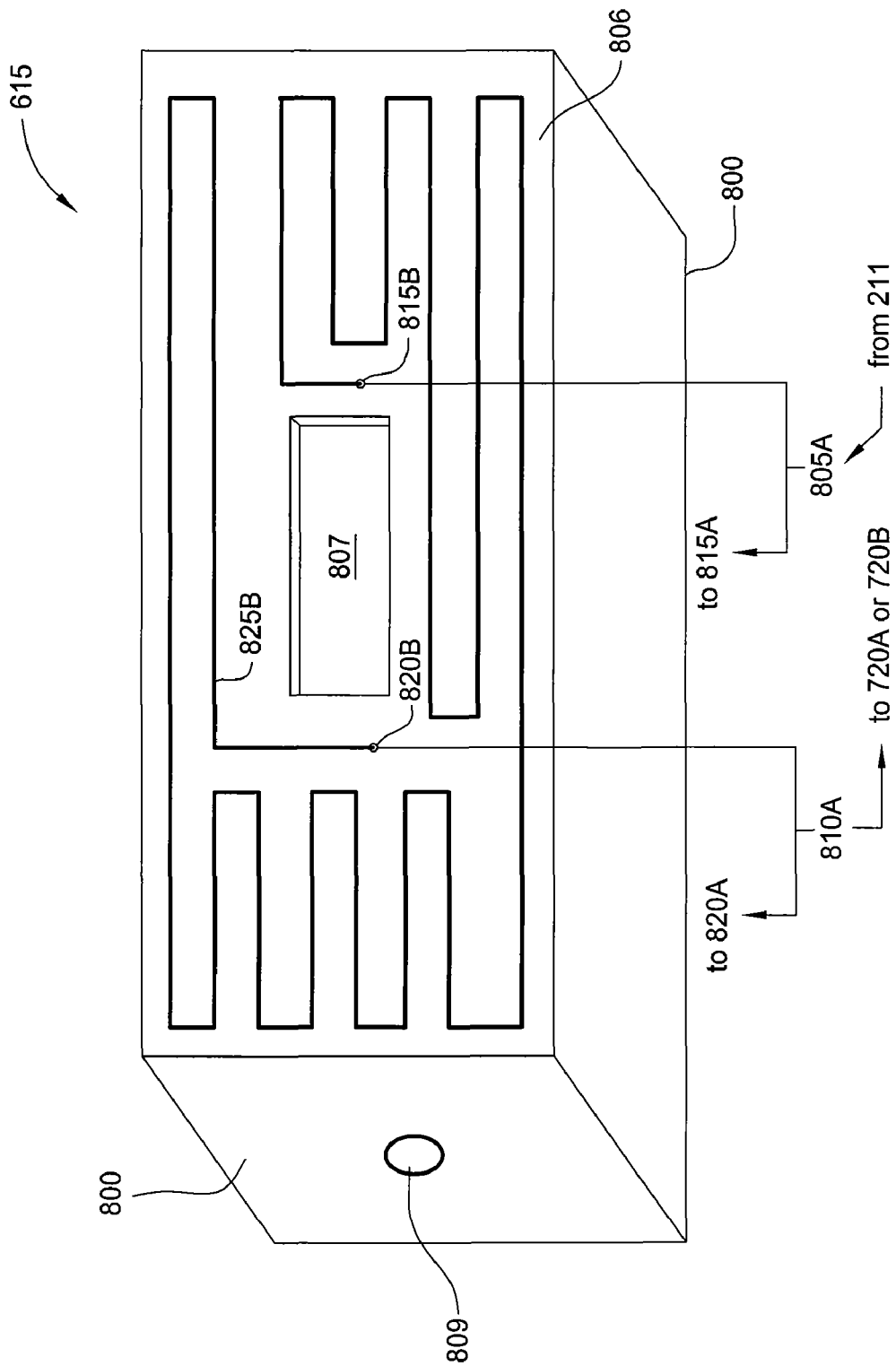
FIG. 8B is an isometric bottom view of the motor housing shown in FIG. 8A.

FIG. 8B is an isometric bottom view of the motor housing 615 shown in FIG. 8A. The housing 615 includes a bottom 806 that may include a sealable opening 807 for electrical lines or signal cables routed to the motor enclosed therein. An opening 809 is formed in one of the sidewalls 800 to receive a shaft (not shown) and/or a vacuum bearing or seal (not shown). The bottom 806 is coupled to the inlet 805 that may be either of the first inlet 705A or second inlet 705B of FIG. 7A. The inlet 805 is coupled to an inlet port 815B which is coupled to a cooling channel 825B formed in or disposed on the bottom 806. Cooling fluid flows from the inlet 805 to the inlet port 815B and through the cooling channel 825B to an outlet port 820B. The outlet port 820B is coupled to the outlet 810 that may be either of the first outlet 710A or second outlet 710B of FIG. 7A. Cooling fluid flows from the outlet 810 to either one of the first conduit 720A or the second conduit 720B (FIG. 7A).

The cooling channels 825A, 825B disposed on the lid 802 and bottom 806 provide for heat transfer from the motor disposed therein and/or heat transfer from a substrate (not shown) disposed on the end effector (not shown). Thus, heat inside the motor housing 615 is significantly reduced, which prevents overheating of the motor and enhances service life of the motor.

Embodiments described herein provide a transfer robot 125 capable of supporting and transferring at least two large area substrates in a vacuum enclosure having a low pressure atmosphere. The transfer robot 125 includes a plurality of drive systems that are separated from the vacuum enclosure to prevent or minimize particles and/or outgassing from entering the vacuum enclosure. The transfer robot 125 also facilitates enhanced serviceability as compared to conventional robots having telescoping support shafts and/or bellows arrangements adapted to move an end effector coupled on an upper surface thereof in a vertical direction. For example, to disassemble the conventional robots for service, the vacuum enclosure may need to be at least partially disassembled. For instance, if seals and/or components disposed in the support shaft need to be serviced, an upper portion of the conventional robot may need to be removed. A roof or lid of the vacuum enclosure may prevent lifting of the upper portion without disassembly of the lid. The transfer robot 125, as described herein, may be lowered or raised within the vacuum enclosure without disassembly of the lid to service or maintain components disposed thereon. This reduces downtime and maintenance costs while enhancing throughput.

While the foregoing is directed to embodiments of the present invention, other and further embodiments of the invention may be devised without departing from the basic scope thereof, and the scope thereof is determined by the claims that follow.

The invention claimed is:

1. A transfer robot for use in a vacuum environment, comprising:
a lift assembly comprising a first platform and a second platform;
a plurality of support members coupling the first platform to the second platform, the plurality of support members comprising:
a first pair of support members, each having a first end rotatably coupled to the first platform and a second end coupled to the second platform by a first linear assembly; and
a second pair of support members, each having a first end rotatably coupled to the second platform and a second end coupled to the first platform by a second linear assembly, the first pair and second pair of support members coupled together at a center thereof;
a first drive assembly coupled to the second pair of support members, the first drive assembly providing a motive force to the plurality of support members to change the angle of the second pair of support members relative to the first pair of support members to move the second platform in a first linear direction relative to the first platform;
an end effector assembly disposed on the second platform and movable in a second linear direction by a second drive assembly, the second linear direction being orthogonal to the first linear direction; and
a plurality of fluid conduits movably coupled between the first platform and the second platform, at least a portion of the plurality of fluid conduits fixed relative to portions of each of the first pair and second pair of support members and coupled with rotatable vacuum seals.

2. The apparatus of claim 1, further comprising:
a fixed base coupled to the first platform by a rotational drive assembly.

3. The apparatus of claim 1, further comprising:
a hermetically sealed enclosure disposed in the second platform, the enclosure having at least a portion of the second drive assembly disposed therein.

4. The apparatus of claim 3, wherein the second drive assembly includes at least one motor housed in the hermetically sealed enclosure.

5. The apparatus of claim 4, wherein the at least one motor is disposed in a housing within the hermetically sealed enclosure and the housing comprises a plurality of cooling fluid channels disposed therein.

6. The apparatus of claim 1, wherein the first linear assembly and the second linear assembly comprise linear bearings.

7. The apparatus of claim 1, wherein the end effector assembly comprises a wrist and a plurality of fingers extending from the wrist.

8. The apparatus of claim 7, wherein the end effector assembly comprises at least two stacked and independently movable end effector modules, each end effector module comprising a wrist and a plurality of fingers extending from the wrist.

9. The apparatus of claim 8, wherein the second drive assembly includes a plurality of first linear drive rails and a plurality of second linear drive rails movably coupled to the first linear drive rails.

10. The apparatus of claim 9, further comprising:
a fluid channel in communication with at least a portion of the plurality of first linear drive rails.

11. The apparatus of claim 10, wherein the fluid channel is coupled to a plurality of fluid conduits movably coupled between the second base and the platform, at least a portion of the plurality of fluid conduits fixed relative to portions of each of the plurality of support members and coupled with rotatable vacuum seals.

12. A transfer robot for use in a vacuum environment, comprising:
- a first assembly comprising a fixed first base coupled to a second base by a first motor that rotates the second base relative to the first base;
- a platform;
- a plurality of support members coupling the second base to the platform, the plurality of support members pivotably coupled together at a center thereof;
- a second motor coupled to at least one of the plurality of support members, the second motor providing a motive force to one end of the at least one support member to pivot the at least one support member relative to other support members to move the platform in a first linear direction relative to the second base; and
- at least a first end effector assembly disposed on the platform that is movable in a second linear direction by a first linear drive that is at least partially disposed in a hermetically sealed enclosure, the second linear direction being orthogonal to the first linear direction, wherein the hermetically sealed enclosure includes a port coupled to a plurality of fluid conduits movably coupled between the second base and the platform, at least a portion of the plurality of fluid conduits fixed relative to portions of each of the plurality of support members and coupled with rotatable vacuum seals.

13. A transfer robot for use in a vacuum environment, comprising:
- a first assembly comprising a fixed first base coupled to a second base by a first motor that rotates the second base relative to the first base;
- a platform;
- a plurality of support members coupling the second base to the platform, the plurality of support members pivotably coupled together at a center thereof;
- a second motor coupled to at least one of the plurality of support members, the second motor providing a motive force to one end of the at least one support member to pivot the at least one support member relative to other support members to move the platform in a first linear direction relative to the second base;
- a first end effector assembly disposed on the platform that is movable in a second linear direction by a first linear drive that is at least partially disposed in a hermetically sealed enclosure, the second linear direction being orthogonal to the first linear direction; and
- a second end effector assembly that is independently movable in the second linear direction by a second linear drive that is at least partially disposed in the hermetically sealed enclosure, wherein the first and second linear drives comprise:
- a plurality of first linear drive rails and a plurality of second linear drive rails movable coupled to the first linear drive rails;
- a belt coupled between a motor and a respective end effector assembly; and
- a fluid channel in communication with at least a portion of the plurality of first drive rails.

* * * * *